US006836260B2

(12) United States Patent
Cok

(10) Patent No.: US 6,836,260 B2
(45) Date of Patent: Dec. 28, 2004

(54) LIGHT EMITTING FLAT-PANEL DISPLAY

(75) Inventor: Ronald S. Cok, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 141 days.

(21) Appl. No.: 09/919,442

(22) Filed: Jul. 31, 2001

(65) Prior Publication Data

US 2003/0057420 A1 Mar. 27, 2003

(51) Int. Cl.[7] ........................... G09G 3/12; G09G 5/00; H01L 33/00; G01R 31/26; G01R 31/00

(52) U.S. Cl. ............................ 345/45; 345/46; 345/77; 345/214; 257/98; 257/99; 257/103; 324/537; 324/765; 324/770

(58) Field of Search ........................... 257/98, 99, 103, 257/10, 40; 345/45, 46, 77, 214; 324/537, 770, 765

(56) References Cited

U.S. PATENT DOCUMENTS

| | | | | |
|---|---|---|---|---|
| 4,769,292 A | | 9/1988 | Tang et al. | |
| 5,061,569 A | * | 10/1991 | VanSlyke et al. | 428/457 |
| 5,157,525 A | * | 10/1992 | Eaton et al. | 345/87 |
| 5,327,373 A | * | 7/1994 | Liu et al. | 365/112 |
| 5,416,516 A | * | 5/1995 | Kameyama et al. | 348/246 |
| 5,486,738 A | * | 1/1996 | Saika et al. | 315/169.3 |
| 5,776,623 A | * | 7/1998 | Hung et al. | 428/690 |
| 5,910,792 A | * | 6/1999 | Hansen et al. | 345/74.1 |
| 5,937,272 A | * | 8/1999 | Tang | 438/30 |
| 6,028,327 A | * | 2/2000 | Mizoguchi et al. | 257/98 |
| 6,081,073 A | * | 6/2000 | Salam | 315/169.2 |
| 6,320,325 B1 | * | 11/2001 | Cok et al. | 315/169.3 |
| 6,359,398 B1 | * | 3/2002 | Nakajima et al. | 315/369 |
| 6,414,661 B1 | * | 7/2002 | Shen et al. | 345/82 |
| 6,501,230 B1 | * | 12/2002 | Feldman | 315/169.3 |

FOREIGN PATENT DOCUMENTS

JP 359210435 A * 11/1984

* cited by examiner

*Primary Examiner*—Long Pham
*Assistant Examiner*—Shrinivas H. Rao
(74) *Attorney, Agent, or Firm*—Andrew J. Anderson; Thomas H. Close

(57) ABSTRACT

A light emitting flat-panel display includes a plurality of light emitting diodes; a sensor for sensing the light output of at least one of the light emitting diodes to produce a light output signal; and a display controller responsive to the light output signal for producing a signal representing the remaining useful life of the display.

11 Claims, 2 Drawing Sheets

LIGHT EMITTING FLAT-PANEL DISPLAY

FIELD OF THE INVENTION

The present invention relates to light emitting flat-panel displays, and more particularly to means for signaling the remaining useful life of such displays.

BACKGROUND OF THE INVENTION

Emissive flat-panel display devices are widely used in conjunction with computing devices and in particular with portable devices. Over time, the efficiency and effectiveness of the displays change and the quality of the displays, particularly for sensitive applications such as imaging, declines. This decrease in quality can be due to changes in the materials comprising the display, degradation in electronic components, and the like.

In particular, organic light emitting diode (OLED) display devices suffer from changes in the organic light emitting materials within the display. The changes affect the efficiency and brightness of the display. These changes may also be color dependent, that is, the changes affect the different colors in the display device in different ways so that over time not only does the power efficiency of the display device decrease but the color balance changes. These changes result in an inferior display with poor image and color rendition.

Some imaging applications are critical, that is, they cannot be allowed to fail. For example, some applications within the military and medical fields fall into this critical category. Moreover, within large systems, regular maintenance is often used to replace components, such as display devices, at fixed intervals whether or not the device is about to fail. Unnecessary replacement wastes resources. To address these concerns, some imaging systems, such as white-light projectors, utilizing radiation sources measure the time that the radiation source is turned on. Comparing this measurement to known life times allows a system to recommend maintenance or replacement. However, this approach is not useful for displays with light emitting elements and variable display content since the degradation of the light emitting elements is dependent on the exercise of each element.

There is a need therefore for an improved emissive flat-panel display system that improves the maintainability and reduces the operational costs of the display system.

SUMMARY OF THE INVENTION

The need is met according to the present invention by providing a light emitting flat-panel display that includes a plurality of light emitting diodes; a sensor for sensing the light output of at least one of the light emitting diodes to produce a light output signal; and a display controller responsive to the light output signal for producing a signal representing the remaining useful life of the display. In a preferred embodiment, the display is an organic light emitting diode display.

ADVANTAGES

The present invention has the advantage that it reduces the life-cycle costs and improves the reliability of an emissive flat-panel display device.

DETAILED DESCRIPTION OF THE INVENTION

Flat-panel display devices degrade over time as they are used. In particular, the light emitting or controlling materials become less effective and accurate, resulting in a loss of brightness and accuracy in color rendition. For those flat-panel display devices for which the brightness of each light emitting or controlling element can be detected and measured, the present invention provides a system wherein a detector supplies a light output signal to a controller. The controller processes the light output signal and calculates an estimated lifetime for the display device. This estimated lifetime may be made accessible to an external system or the controller may signal an external system when particular display device lifetime parameters are met.

Figure 1:
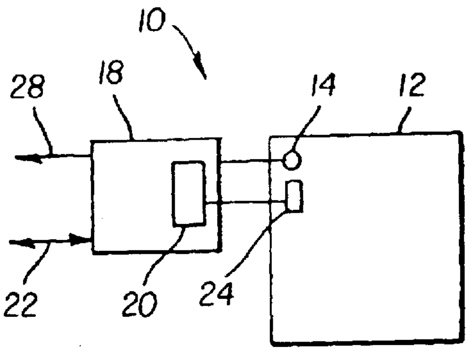
FIG. 1 is a schematic block diagram of a light emitting display according to the present invention.

Referring to FIG. 1, a flat-panel display system 10 includes a flat-panel display 12 with light emitting diodes 14, a display controller 18 includes a storage device 20, a sensor 24 (such as a photo diode) to produce a light output signal, and produces a signal 28 representing the remaining useful life of the display. The controller 18 signals the light emitting diode 14 to produce a desired light output value. The sensor 24 detects the light emitted by the light emitting diode 14 in the display and provides this information to the controller 18. The controller 18 then calculates an estimate of the lifetime of the display by comparing the light output value to the desired value originally sent to the display element by extrapolating the comparison according to known degradation rates. This estimate is stored in the storage device 20. This storage device may be accessible from an external system using traditional read and write signals 22 applied to the storage device 20. Alternatively, when a particular lifetime parameter is exceeded, the controller may signal an external system with the signal 28.

Figure 2:
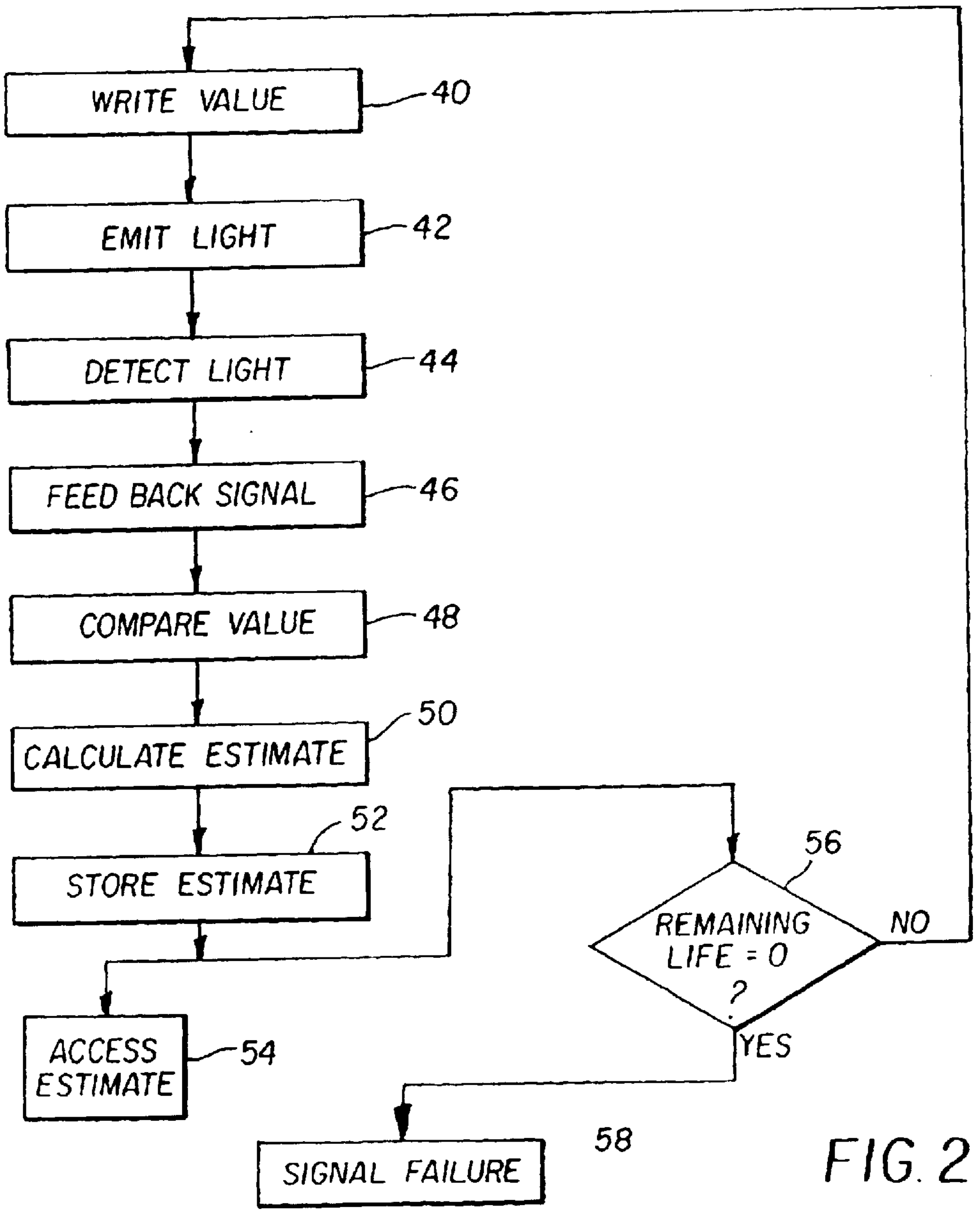
FIG. 2 is a flow chart showing the operation of the display shown in FIG. 1.

Referring to FIG. 2, the operation of the display device will be described. The controller first signals 40 a light emitting diode to produce a desired light output value. The light emitting diode emits 42 an amount of light in response to the signal. The sensor detects 44 the emitted light and provides 46 a light output signal to the controller. The controller compares 48 the light output signal to the desired light output value and calculates 50 an estimate of the remaining lifetime of the display. The estimate is stored 52 in the memory device and is available for access 54 by an external system (not shown). Alternatively, when the estimate of the remaining useful lifetime is zero 56, the controller generates 58 a signal that is supplied to an external system (not shown).

Figure 3:
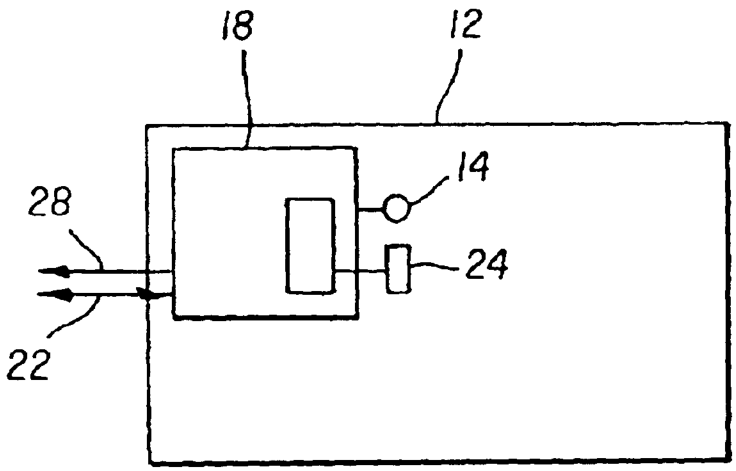
FIG. 3 is a schematic block diagram of a light emitting display according to a further embodiment of the present invention where the controller is integrated on the same substrate as the display.

As shown in FIG. 3, the sensor 24 and controller 18 can be integrated on a common substrate or contained within a common package with the display 12. Alternatively, the sensor and/or controller may be implemented externally to the display on a separate integrated circuit or printed circuit board as was shown in FIG. 1. By including the sensor 24 and controller 18 within a common package or upon a common substrate with the flat-panel display 12, the number of electrical signal leads necessary for the flat-panel display can be minimized.

In a preferred embodiment, the display device is an Organic Light Emitting Diode (OLED) display which is composed of small molecule polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light emitting displays can be used to fabricate such a device.

Figure 4:
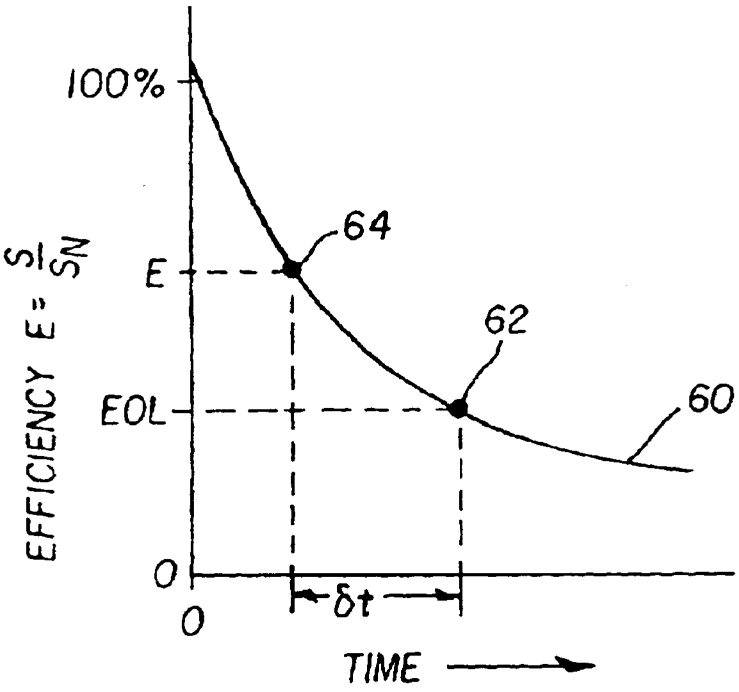
FIG. 4 is a graph useful in describing the calculation of remaining useful life of the display.

Referring to FIG. 4, a graph 60 of the efficiency of an OLED display vs. time used is shown. The graph can be generated empirically by measuring the decrease in efficiency of a number of diodes over time and averaging the results. The remaining useful life of an OLED display can be calculated, for example, by taking the ratio of the signal S from the sensor with an expected signal $S_N$ that would be produced if the display was new to produce an efficiency value E. When the efficiency value E reaches a predetermined threshold 62 (e.g. 50%), the display is said to have reached the end of its useful life (EOL). The remaining useful life of the display is calculated using the efficiency function 60. The remaining useful life δt is the difference between the measured efficiency 64 and the threshold efficiency 62.

The invention has been described in detail with particular reference to certain preferred embodiments thereof, but it will be understood that variations and modifications can be effected within the spirit and scope of the invention.

PARTS LIST

10 flat panel display system
12 flat-panel display
14 light emitting diodes
18 display controller
20 storage device
22 read and write signals
24 sensor
28 signal
40 signal step
42 emitting step
44 detecting step
46 providing step
48 comparing step
50 calculating step
52 storing step
54 access step
56 comparison step
58 generating step
60 graph of efficiency vs. time
62 efficiency at end of useful life of display
64 measured efficiency

What is claimed is:

1. A light emitting flat-panel display comprising:
a plurality of light emitting diodes;
a sensor for sensing the light output of at least one of the light emitting diodes to produce a light output signal; and
a display controller responsive to the light output signal, the controller including means for producing a signal representing the remaining useful life of the display.

2. The light emitting display claimed in claim 1, wherein the controller includes means for comparing the light output signal to a pre-determined criterion to determine the remaining useful life of the display.

3. The light emitting display claimed in claim 1, wherein the display is a color display having groups of differently colored light emitting diodes and further comprising a separate sensor for each group in the flat-panel display.

4. The light emitting display claimed in claim 2, wherein the display is a color display having groups of differently colored light emitting diodes and further comprising a separate sensor for each group in the flat-panel display and wherein there is a different pre-determined criterion for each group.

5. The light emitting display claimed in claim 1, wherein the light emitting diodes, the sensor, and the controller are integrated on a common substrate.

6. The light emitting display claimed in claim 1, wherein the light emitting diodes, the sensor, and the controller are contained within a common package.

7. The light emitting display claimed in claim 1, wherein the display further comprises an addressable memory connected to the controller and wherein the signal representing the remaining useful life of the display is stored in the memory and accessible external to the display.

8. The light emitting display claimed in claim 1, wherein the controller includes means for generating an interrupt signal when the remaining useful life of the display is less than a predetermined criterion for communication to a device external to the display.

9. The light emitting display claimed in claim 1, wherein the signal representing the remaining useful life of the display has a range of values corresponding to the expected life-time of the display.

10. The light emitting display claimed in claim 1, wherein the signal representing the remaining useful life of the display is a binary value representing whether or not the display has reached the end of useful life.

11. The light emitting display claimed in claim 1, wherein the diodes are organic light emitting diodes.

* * * * *